United States Patent [19]

Rossetti et al.

[11] Patent Number: 4,703,327
[45] Date of Patent: Oct. 27, 1987

[54] INTERROGATOR/RECEIVER SYSTEM FOR USE WITH A REMOTE TRANSPONDER

[75] Inventors: Anthony J. Rossetti, San Jose; Paul A. Nysen, Sunnyvale, both of Calif.

[73] Assignee: X-Cyte, Inc., Mountain View, Calif.

[21] Appl. No.: 793,704

[22] Filed: Oct. 31, 1985

[51] Int. Cl.⁴ .......................................... G01S 13/74
[52] U.S. Cl. ...................................... 342/44; 342/51
[58] Field of Search ............................ 342/51, 44, 42

[56] References Cited

U.S. PATENT DOCUMENTS

| | | | |
|---|---|---|---|
| 3,870,994 | 3/1975 | McCormick et al. | 342/42 |
| 4,059,831 | 11/1977 | Epstein | 342/44 |
| 4,297,701 | 10/1981 | Henriques | 342/42 |
| 4,620,191 | 10/1986 | Skeie | 342/51 |
| 4,625,207 | 11/1986 | Skeie | 342/51 |
| 4,625,208 | 11/1986 | Skeie et al. | 342/51 |

Primary Examiner—Thomas H. Tarcza
Assistant Examiner—Donald E. Hayes, Jr.
Attorney, Agent, or Firm—Karl F. Milde, Jr.

[57] ABSTRACT

Interrogator/receiver apparatus is disclosed for transmitting a first signal to, and receiving a second signal from a remote transponder. In the preferred embodiment, the transponder is a passive, surface acoustic wave device which receives the first signal, processes this signal and transmits, in reply, the second signal which includes a unique identification code. The interrogator/receiver apparatus includes (1) a common RF unit for generating the first (interrogation) signal and (2) a plurality of transmitter/receiver heads, each remote from, and coupled to the common signal generator, for transmitting the first signal to, and receiving the second signal from a transponder or transponders in its vicinity. Advantageously, each transmitter/receiver head includes a signal mixer which performs four quadrant multiplication of the first signal by the second signal to produce a third, audio frequency signal containing frequencies equal to the instantaneous difference between the frequencies of the first and second signals. One of the mixer inputs is coupled to the RF transmission line connected to the common RF signal generator, or to a transmit amplifier connected to the transmission line; the other mixer input is connected to a directional coupler that, in turn, is connected to a common transmit/receive antenna. This directional coupler operates to pass the first signal from the transmission line, or transmit amplifier, to the antenna and to pass the second signal from the antenna to the mixer.

16 Claims, 15 Drawing Figures

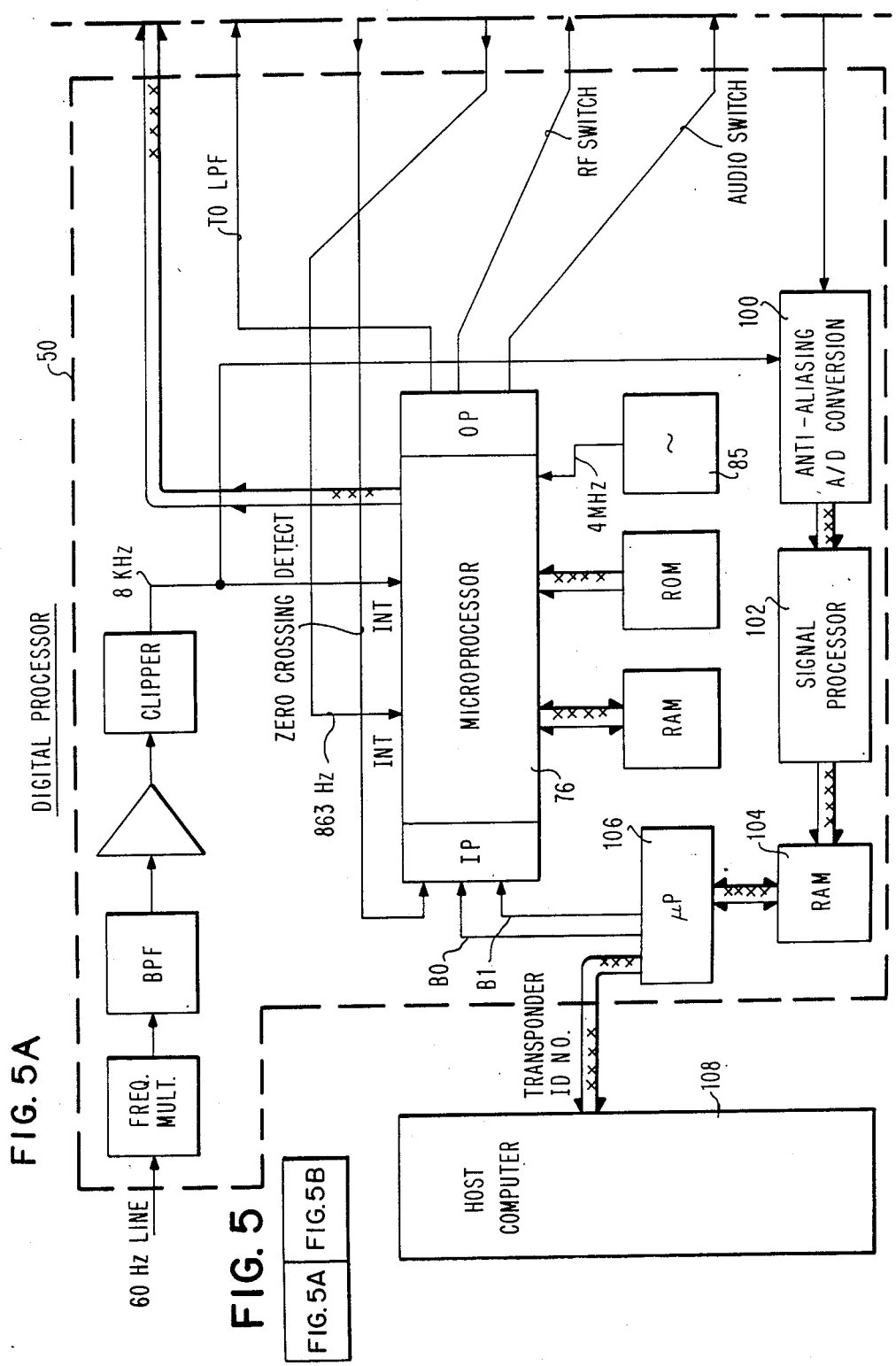

TRANSMITTER / RECEIVER HEAD

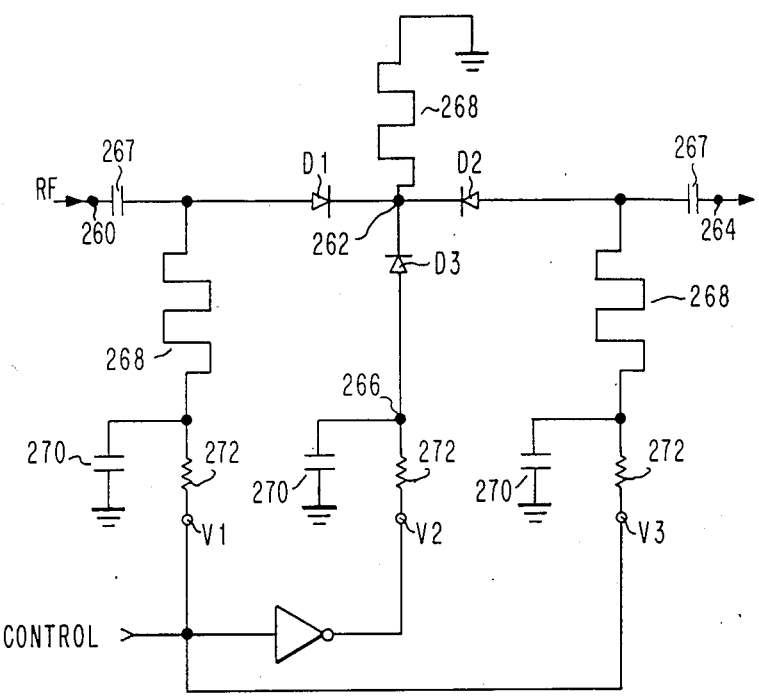
FIG. 12   RF SWITCH
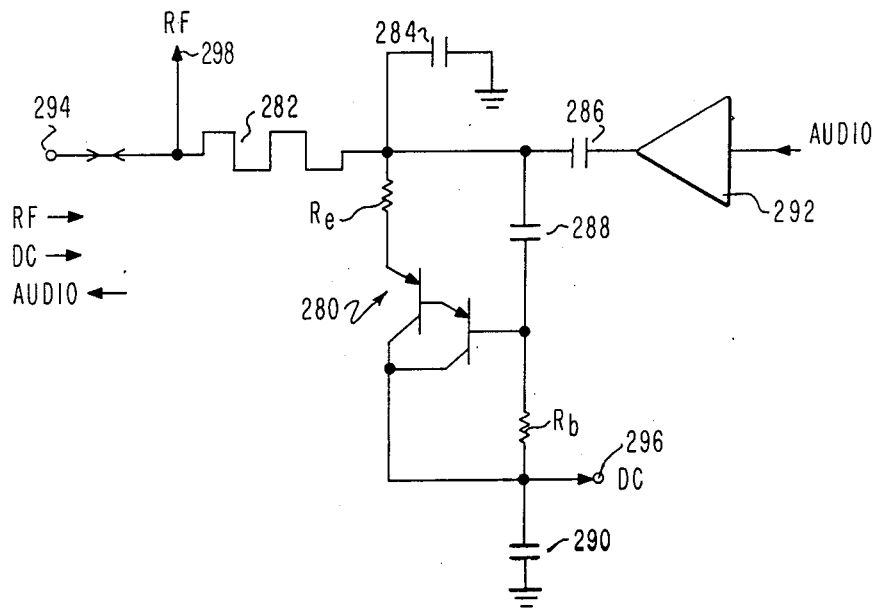
FIG. 13   GYRATOR

INTERROGATOR/RECEIVER SYSTEM FOR USE WITH A REMOTE TRANSPONDER

CROSS-REFERENCE TO RELATED APPLICATIONS

The present application is related in subject matter to the following commonly-owned applications for patent:

Application Serial No. 509,523, filed June 30, 1983, of Paul A. Nysen, Halvor Skeie and Donald Armstrong for "System for Interrogating a Passive Transponder Carrying Phase-Eacoded Information";

Application Ser. No. 793,165 filed Oct. 31, 1985 of Paul A. Nysen and Michael R. McCoy for "Passive Interrogator Label System Having Offset Compensation and Temperature Compensation for a Surface Acoustic Wave Transponder"

BACKGROUND OF THE INVENTION

The present invention relates to interrogator/receiver apparatus for transmitting a first signal to, and receiving a second signal from a remote transponder. More particularly, the invention relates to interrogator/receiver apparatus for use with transponders which are capable of receiving an interrogating first signal, processing this signal and transmitting, in reply, a second signal that is derived from the first signal and contains encoded information.

Because the aforementioned encoded information normally includes an identification code which is unique to each transponder, and because the transponders of this type are relatively light weight and small and may be easily attached to other objects to be identified, the transponders are sometimes referred to as "labels". The entire system, including the interrogator/receiver apparatus and one or more passive transponders, is therefore often referred to as a "passive interrogator label system" or "PILS".

Passive interrogator label systems of the type which the present invention relates are disclosed in the following U.S. patents:

| U.S. Pat. No. | Patentee |
| --- | --- |
| 3,273,146 | Horwitz, Jr. |
| 3,706,094 | Cole, et al. |
| 3,755,803 | Cole, et al. |
| 3,981,011 | Bell |
| 4,058,217 | Vaughan, et al. |
| 4,059,831 | Epstein |
| 4,263,595 | Vogel |

Such a system is also disclosed in the commonly-owned patent applications referred to above.

In general, a passive interrogator label system includes an "interrogator" for transmitting a first radio frequency signal; at least one passive transponder which receives this first signal, processes it and sends back a second radio frequency signal containing encoded information; and a receiver, normally located next to the interrogator, for receiving the second signal and decoding the transponder-encoded information.

In the aforementioned patent application Ser. No. 509,523, a passive interrogator label system is disclosed in which the interrogator transmits a first signal having a first frequency that successively assumes a plurality of frequency values within a prescribed frequency range. This first frequency may, for example, be in the range of 905–925 MHz, a frequency band that is freely available in many parts of the world for short range transmissions.

A passive (i.e., nonpowered) transponder associated with this system receives the first (interrogating) signal as an input and produces a second (reply) signal as an output. Passive signal transforming means within the transponder, which converts the first signal to the second signal, includes:

(1) A multiplicity of "signal conditioning elements" coupled to receive the first signal from a transponder antenna. Each signal conditioning element provides an intermediate signal having a known delay and a known amplitude modification to the first signal.

(2) A single "signal combining element" coupled to all of the signal conditioning elements for combining the intermediate signals to produce the second signal. This second signal is coupled out to the same or a separate antenna for transmission as a reply.

The signal conditioning elements and the signal combining element impart a known informational code to the second signal which identifies, and is associated with, the particular transponder.

The receiving and decoding apparatus associated with the system includes apparatus for receiving the second signal from the transponder and a mixer arranged to receive both the first signal and the second signal for performing four quadrant multiplication of these two signals. The mixer produces, as an output, a third signal containing the difference frequencies (or frequencies derived from the difference frequencies) of the first and second signals, respectively.

Finally, the system disclosed in the aforementioned U.S. patent application Ser. No. 509,523 includes a signal processor, responsive to the third signal produced by the mixer, for detecting the phases and amplitudes of the respective difference frequencies contained in the third signal, thereby to determine the informational code associated with the interrogated transponder.

This particular system has a number of advantages over passive interrogator label systems of the type disclosed in the issued U.S. patents referred to above. For example, this system exhibits substantially improved signal-to-noise performance over the prior known systems. Also, the output of the signal mixer—namely, the third signal which contains the difference frequencies of the first (interrogating) signal and the second (reply) signal—may be transmitted over inexpensive, shielded, twisted-pair wires because these frequencies are in the audio ranse. Furthermore, since the audio signal is not greatly attenuated or dispersed when transmitted over long distances, the signal processor may be located at a position quite remote from the signal mixer.

In practice, a passive interrogator label system is frequently configured such that a plurality of transponders are interrogated from a number of locations. For example, if the transponders (labels) are carried on persons who are authorized entry into a building, the transmitting and receiving antennas are normally located near several doors to the building.

As another example, the labels may be placed on cattle which are monitored at a number of locations, such as a holding area, a feeding area and the like. The labels may also be placed on railroad cars to permit car identification at various locations throughout a switchyard or rail network.

In such configurations, it has been necessary to provide separate interrogator/receiver apparatus at each location from which the labels are to be monitored. As the number of locations increases, the equipment requirements and costs also increase dramatically.

SUMMARY OF THE INVENTION

It is a principal object of the present invention to provide interrogator/receiver apparatus for a passive interrogator label system which is extremely flexible and may be used to monitor transponder labels at an arbitrarily large number of locations without substantial increase in cost.

It is a further object of the present invention to provide a separate transmitter/receiver head for interrogator/receiver apparatus which produces the aforementioned audio-frequency third signal from the aforementioned first (interrogating) signal and second (reply) signal at a point immediately adjacent the receiver antenna.

These objects, as well as further objects which will become apparent from the discussion that follows are achieved, according to the present invention, by providing interrogator/receiver apparatus which includes (1) a common RF unit for generating the first (interrogation) signal, and (2) a plurality of transmitter/receiver heads, each remote from, and coupled to the common RF signal generator, for transmitting the first signal to, and receiving the second signal from a transponder or transponders in its vicinity.

The interrogator/receiver apparatus according to the invention may be used to interrogate and receive replies from transponders (labels) at a large number of locations without substantially increasing the cost over that of a system which monitors labels from only a single location. Such economies are made possible because the transmitter/receiver heads may be quite inexpensive, comprising little more than a single transmitting/receiving antenna and means for selectively connecting this antenna to the common signal generator.

According to one preferred feature of the present invention, each remote transmitter/receiver head is connected to the common RF signal generator by a controllable switch, and a switch control device is provided for controlling all switches such that, at any given instant of time, only one switch is in the closed position. In this way, the interrogating first signal supplied from the signal generator is passed to only one remote transmitter/receiver head at a time.

Advantageously, each switch is formed by a T-network of diodes which are forward or backbiased, respectively, to open or close the switch.

In order to avoid reflections (impedance mismatches) in the transmission lines between the common signal generator and the remote transmitter/receiver heads, a nodal network is connected between the signal generator and the various switches which, in turn, are connected to the transmitter/receiver heads. The nodal network consists of an input node, connected to the signal generator, and a number of output nodes, each connected to one or more of the switches. The electrical distance between the input node and each of the output nodes is made approximately equal to $n\lambda/2$, where n is an integer (0, 1, 2 . . . ), which may be different for different output nodes, and $\lambda$ is the wavelength of the transmitted first signal. The non-terminated ends of the transmission line—i.e., the ends which are connected to open switches—will therefore not produce reflections at the input node that degrade the transmitted signal.

According to another preferred feature of the invention, each transmitter/receiver head includes a signal mixer causing four quadrant multiplication of the first signal by the second signal to produce the third, audio-frequency signal containing frequencies equal to the instantaneous difference between the frequencies of the first and second signals. This mixer has two inputs and an output. One of these inputs is directly coupled to the transmission line connected to the common RF signal generator, or to a transmit amplifier connected to this transmission line; the other input is connected to a directional coupler that, in turn, is connected to a common transmitter/receiver antenna. This directional coupler operates to pass the first signal from the transmission line (or transmit amplifier) to the antenna and to pass the second signal from the antenna to the mixer.

The directional coupler just described makes it possible to simultaneously transmit the first signal and receive the second signal from the same antenna. This arrangement leads to a number of important advantages. The use of a common antenna for both transmitting and receiving has obvious advantages of simplicity and cost, not only in manufacture but also installation. The ability to simultaneously transmit and receive RF signals makes it possible to operate the system in the continuous wave mode. As compared with RF bursts, the use of CW markedly reduces the power output requirement of the system so that both health and jamming hazards are minimized and out-of-bond emissions are easier to control. In a typical system, the power output can be in the order of 3 milliwatts.

According to still another preferred feature of the invention, the single transmission line between the common signal generator and each remote transmitter/receiver head is used to pass the radio-frequency first signal in one direction, the audio-frequency third signal in the opposite direction, and to supply DC power to the active elements in the transmitter/receiver head.

This multiple use of the tranmission line is effected by a so-called "gyrator" which provides a low impedance for DC, but a high impedance for AC above 2 or 3 Hertz.

Still another preferred feature of the present invention includes the provision of an automatic level control at each transmitter/receiver head to eliminate variations in attenuation caused by the different lengths of transmission lines. In the preferred embodiment, the first signal is amplified at the remote transmitter/receiver head to a level at which the signal is clipped. The clipped signal is then applied to a lowpass filter that passes only the transmitted fundamental. This reconverts the transmitted signal back into a sinusoidal signal at the clipped level.

For a full understanding of the present invention, reference should now be made to the following detailed description of the preferred embodiments of the invention and to the accompanying drawings.

BRIEF DESCRIPTION OF THE DRAWINGS

FIGS. 5A and 5B, taken together, illustrate the interrogator/receiver apparatus according to a preferred embodiment of the present invention.

Figure 6:
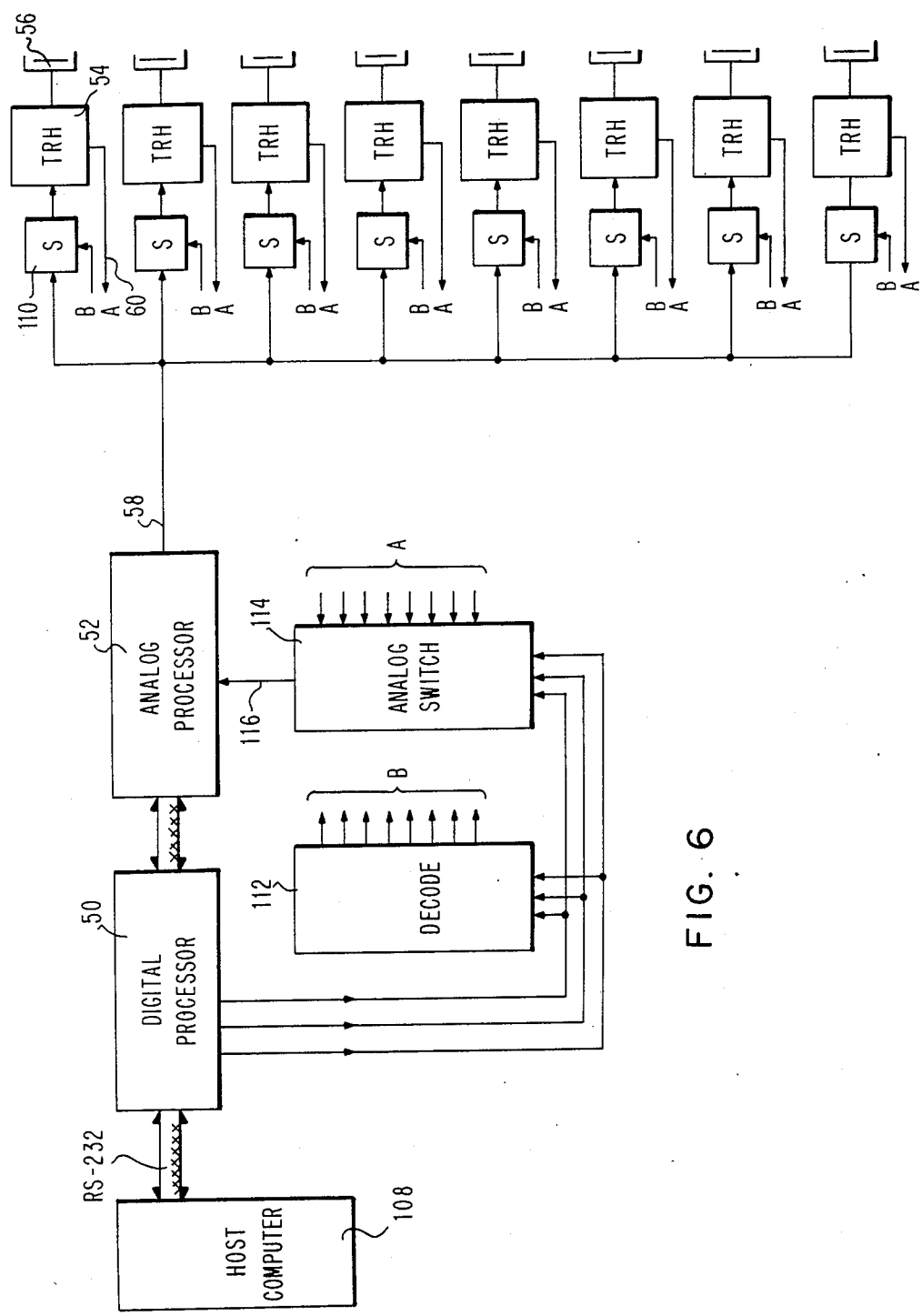
FIG. 6 is a block diagram showing interrogator/receiver apparatus of the type shown in FIG. 5, but which includes a plurality of transmitter/receiver heads.

Fi8. 9 is a schematic and block diagram showing the AC and DC paths in the embodiment of FIG. 6.

Figure 10:
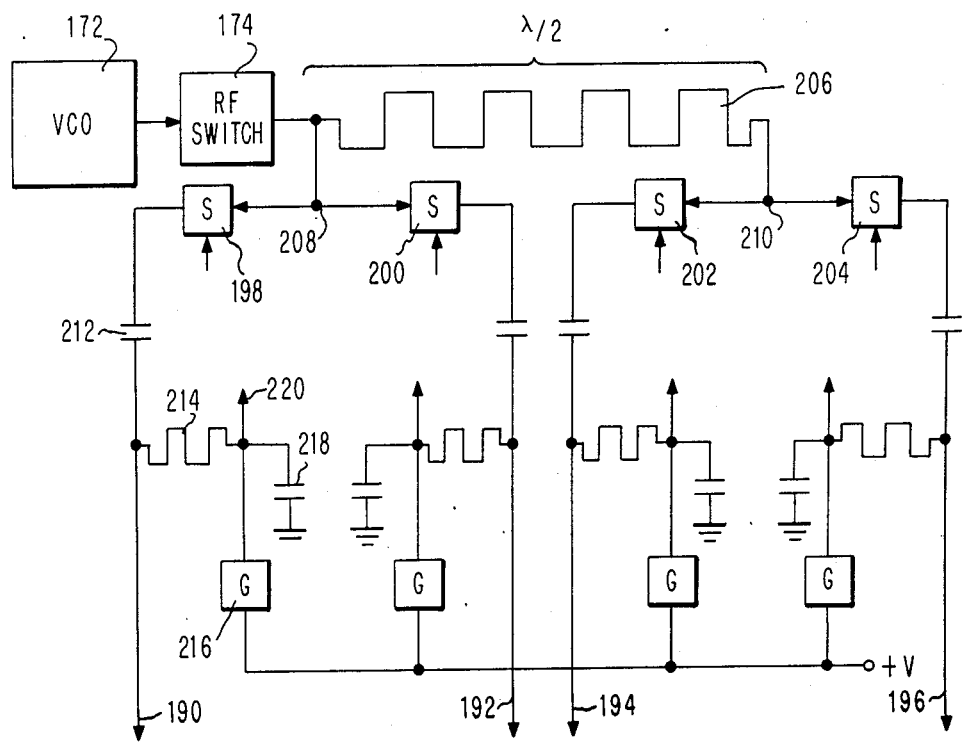

FIG. 10 is a schematic and block diagram showing a specific connection of four RF switches employed in the embodiment of FIG. 6.

Figure 11:
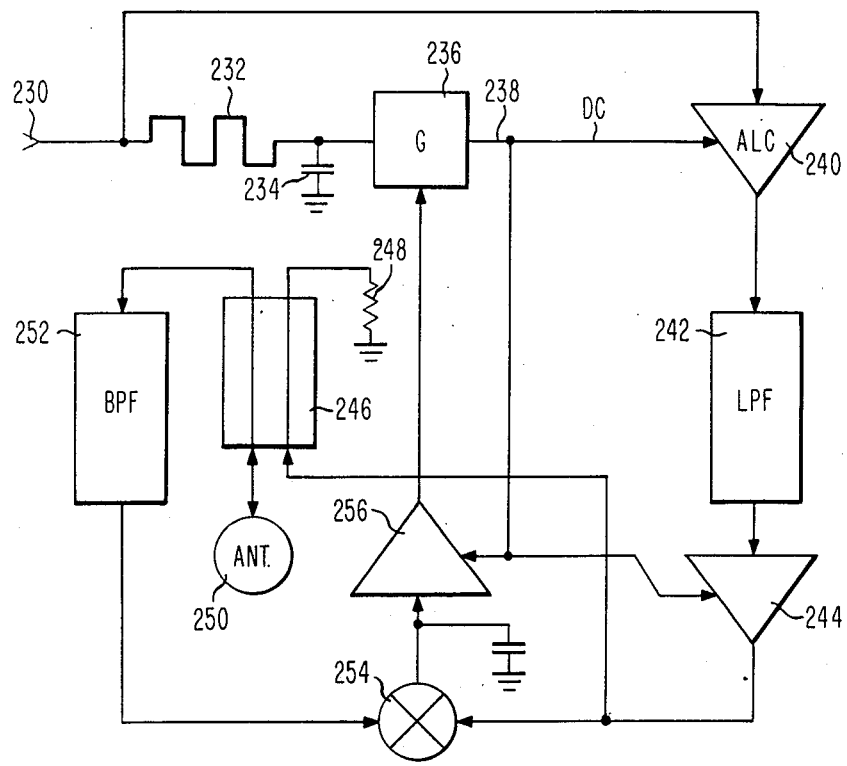

FIG. 11 is a schematic and block diagram of a transmitter/receiver head employed in the embodiments of FIGS. 5 and 6.

FIG. 12 is a schematic diagram of the RF switch employed in the embodiment of FIG. 6.

FIG. 13 is a schematic diagram of a gyrator employed in the embodiments of FIGS. 5 and 6.

DESCRIPTION OF THE PREFERRED EMBODIMENTS

The preferred embodiments of the present invention will now be described with reference to FIGS. 1-13 of the drawings Identical elements in the various figures are designated with the same reference numerals.

Figure 1:
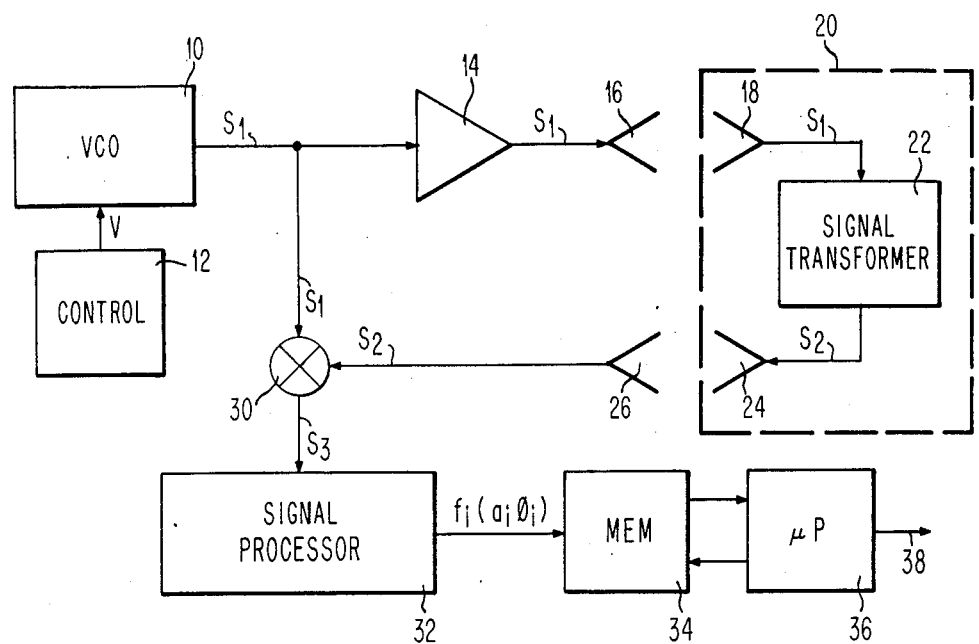
FIG. 1 is a block diagram of a passive interrogator label system of the type disclosed in the aforementioned U.S. patent application Ser. No. 509,523.

FIG. 1 shows the general configuration of the passive interrogator label system disclosed in the aforementioned U.S. Patent Application Ser. No. 509,523. This system comprises a voltage controlled oscillator 10 which produces a first signal S1 at a radio frequency determined by a control voltage V supplied by a control unit 12. This signal S1 is amplified by a power amplifier 14 and applied to an antenna 16 for transmission to a transponder 20.

The signal S1 is received at the antenna 18 of the transponder 20 and passed to a signal transforming element 22. This signal transformer converts the first (interrogation) signal S1 into a second (reply) signal S2. The signal S2 is passed either to the same antenna 18 or to a different antenna 24 for transmission back to the interrogator/receiver apparatus. This second signal S2 carries encoded information which, at a minimum, identifies the particular transponder 20.

The signal S2 is picked up by a receiving antenna 26. Both this second signal S2 and the first signal S1 (or respective signals derived from these two signals) are applied to a mixer (four quadrant multiplier) 30. The signals S1 and S2 are tbus mixed or "homodyned" in the mixer 30 to produce a third signal S3 containing frequencies which include both the sums and the differences of the frequencies contained in the signals S1 and S2. The signal S3 is passed to a signal processor 32 which determines the amplitude $a_i$ and the respective phase $\phi_i$ of each frequency component $f_i$ among a set of audio frequency components ($f_0, f_1, f_2 \ldots$) in the signal S3. Each phase $\phi_i$ is determined with respect to the phase $\phi_=$ of the lowest frequency component $f_0$.

The information determined by the signal processor 32 is passed to a microcomputer comprising a random access memory (RAM) 34 and a microprocessor 36. This microcomputer continuously analyzes the frequency, amplitude and phase information and makes decisions based upon this information. For example, the microcomputer may determine the identification number of the interrogated transponder 20. This I.D number and/or other decoded information is made available at an output 38.

Figure 2:
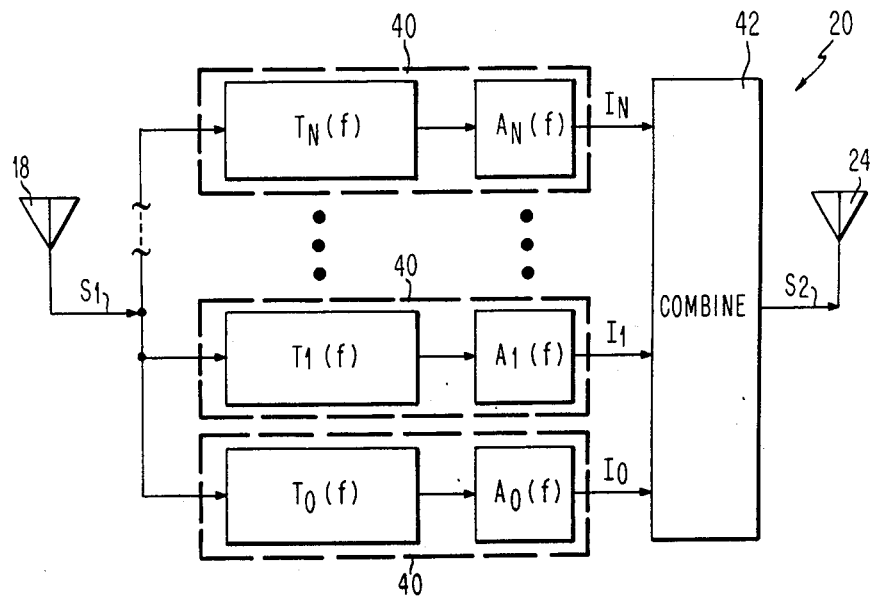
FIG. 2 is a block diagram of a transponder or "label" which is used in the system of FIG. 1.

FIG. 2 illustrates the nature and operation of the transponder 20. This transponder may be an entirely passive device, or it may contain a power source and one or more active elements. As may be seen, the signal transforming element 22, indicated as a block in FIG. 1, comprises a number N+1 of signal conditioning elements 40 and a signal combining element 42. The signal conditioning elements 40 are each connected to the antenna 18 and receive the transmitted interrogation signal S1. Each signal conditioning element 40 produces a respective intermediate signal $I_0, I_1 \ldots I_N$ as an output. These intermediate signals are passed to the combining element 42 which combines these intermediate signals (e.g., by addition, multiplication or the like) to form the reply signal S2.

As may be seen in FIG. 2, each signal conditioning element 40 comprises a known delay $T_i$ and a known amplitude modification $A_i$ (either attenuation or amplification). The respective delay $T_i$ and amplitude modification $A_i$ may be functions of the frequency of the received signal S1, or they may provide a constant delay and constant amplitude modification, respectively, independent of frequency. The order of the delay and amplitude modification elements may be reversed; that is, the amplitude modification elements $A_i$ may precede the delay elements $T_i$. Amplitude modification $A_i$ can also occur within the path $T_i$.

Figure 3A:
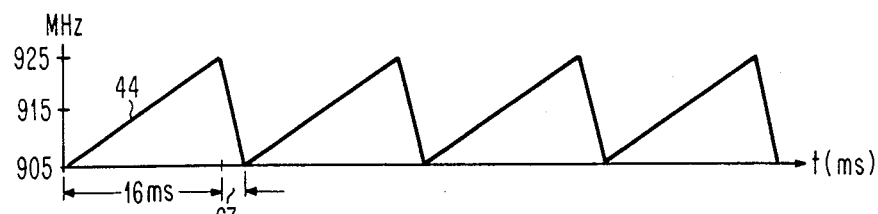
FIGS. 3A and 3B are time diagrams, drawn to different scales, of the radio frequencies contained in the interrogation and reply signals transmitted in the system of FIG. 1.
Figure 3B:
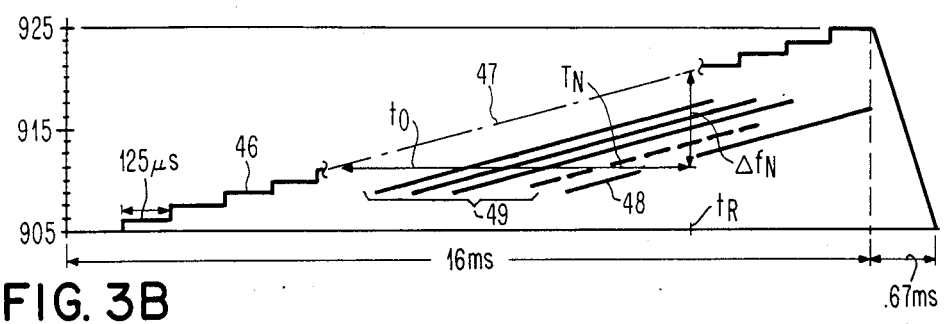

FIGS. 3A and 3B illustrate the frequency of the first signal S1 in the passive interrogator label system shown in FIG. 1. The voltage controlled oscillator 10 is controlled to produce a sinusoidal RF signal with a frequency that is swept in 128 equal steps from 905 MHz to 925 MHz. Each frequency step is maintained for a period of 125 microseconds so that the entire frequency sweep is carried out in 16 milliseconds. Thereafter, the frequency is dropped back to 905 MHz in a relaxation period of 0.67 milliseconds. The stepwise frequency sweep 46 shown in FIG. 3B thus approximates the linear sweep 44 shown in FiG. 3A.

Assuming that the stepwise frequency sweep 44 approximates an average, linear frequency sweep or "chirp" 47, FIG. 3B illustrates how the transponder 20, with its known, discrete time delays $T_0, T_1 \ldots T_N$ produces the second (reply) signal 52 with distinct differences in frequency from the first (interrogation) signal 51. Assuming a round-trip, radiation transmission time of $t_0$, the total round-trip times between the moment of transmission of the first signal and the moments of reply of the second signal will be $t_o+T_0, t_o+T_1, \ldots t_o+T_N$, for the delays $T_{0N}, T \ldots T, 1$ respectively. Considering only the transponder delay $T_N$, FIG. 3B demonstrates that, at the time $t_R$ when the second (reply) signal is received at the antenna Z6, the frequency 48 of this second signal will be $\Delta f_N$ less than the instantaneous frequency 47 of the first signal S1 transmitted by the antenna 16. Thus, if the first and second signals are mixed or "homodyned", this frequency difference $\Delta f_N$ will appear in the third signal as a beat frequency.

Understandably, other beat frequencies will also result from the other delayed frequency spectra 49 resulting from the time delays $T_0, T_1 \ldots T_{N-1}$.

In mathematical terms, we assume that the phase of a transmitted interrogation signal is:

$$\phi = 2\pi f \tau$$

where $\tau$ is the round-trip transmission time delay.

For a ramped frequency df/dt or $\dot{f}$, we have:

$$2\pi \dot{f} \tau = d\phi/dt = \omega.$$

$\omega$, which is the beat frequency, is thus determined by $\tau$ for a given ramped frequency or chirp $\dot{f}$.

Figure 4:
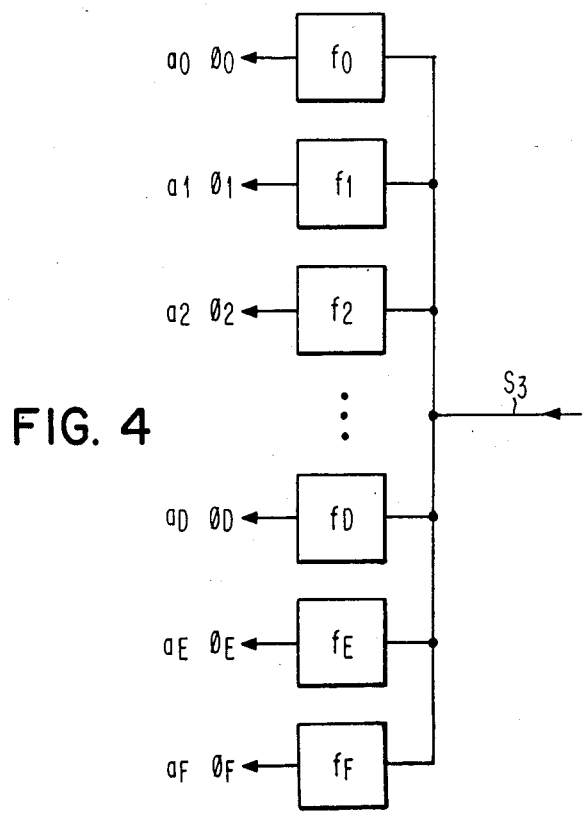
FIG. 4 is a block diagram illustrating the decoding process carried out by the signal processor in the system of FIG. 1.

The function of the signal processor 32 in the system of FIG. 1 is illustrated in FIG. 4. As may be seen, the signal S3 is applied to sixteen bandpass filters, each tuned to a different beat frequency, $f_0, f_1 \ldots f_E, f_F$. The signal processor determines the amplitude and phase of the signals that pass through these respective filters. These amplitudes and phases contain the code or "signature" of the particular signal transformer 22 of the interrogated transponder 20.

In practice, the amplitudes and phases are determined by a well-known "matched filter" calculation; that is, the in-phase or cosinusoid parts and the quadrature phase or sinusoid parts of a known waveform are multiplied, term by term by those of the incoming waveform to determine the correlation or "degree of match". For each of the sixteen frequencies, the signal processor 32 determines two 16-bit numbers, which are the real and imaginary parts, respectively, of the complex phase and amplitude. The amplitude or power ($a_i$) as well as the phase ($\phi_i$) at each respective frequency is then calculated as follows:

$$a_i = [R^2 + I^2]^{\frac{1}{2}}$$

and $$\phi_i = \arctan I/R,$$

where R is the real part and I is the imaginary part of the complex number.

Thereafter, the signal processor 32 stores the amplitude and phase quantities in the RAM 34 for further processing by the microprocessor 36. This microprocessor 36 normalizes the amplitudes and checks to make sure that all amplitudes are within prescribed limits. If one or more of the sixteen amplitudes are above or below the acceptable tolerances, the transponder reading is rejected.

If the amplitudes are within their prescribed limits, the microprocessor 36 determines the differences, modulo 360°, of each of the fifteen phases ($\phi_1, \phi_2 \ldots \phi_D, \phi_E, \phi_F$) with respect to the first phase $\phi_0$; i.e., $\phi_{01} = \phi_0 - \phi_1$ mod 360°, $\phi_{02} = \phi_0 - \phi_2$ mod 360°, $\phi_{03} = \phi_0 - \phi_3$ mod 360°, etc. Each of these phase differences is then located in one of the following four phase "bins"; (1) 0°±30°; (2) 90°±30°; (3) 180°±30°; (4) 270°±30°.

If any phase difference with respect to $\phi_o$ falls outside of these "bins" (i.e., the ranges given above), then the transponder reading is rejected.

If all the sixteen amplitudes and fifteen phase differences are within their prescribed limits, then the selected "bins" are converted to a transponder identification number which will be one of $4^{15}$ possibilities (one of four bins for each phase difference). This number is then presented on the microprocessor output line 38.

Figure 5B:
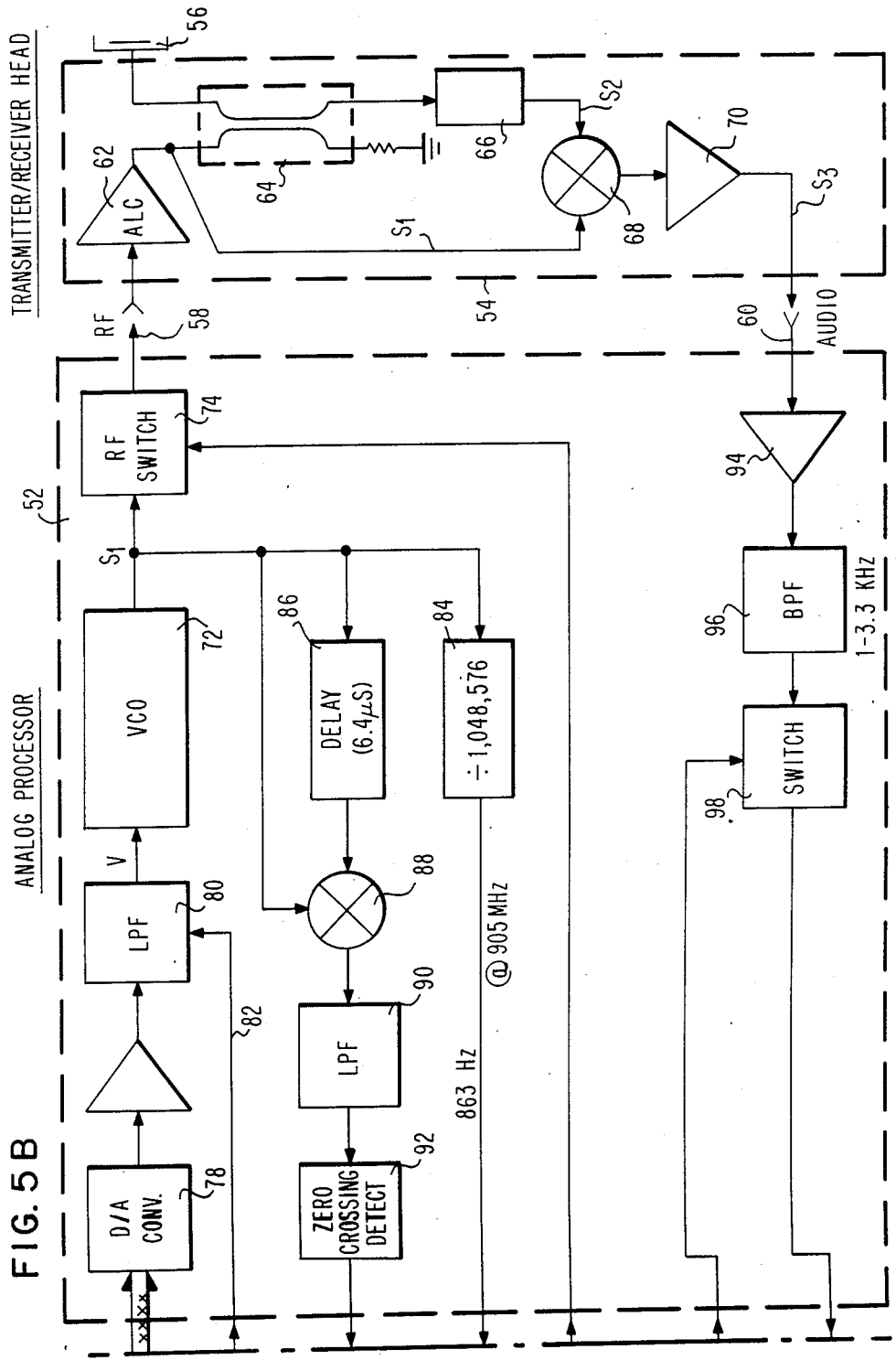

FIGS. 5A and 5B, taken together, illustrate a preferred embodiment of the detailed structure of the system of FIG. 1, configured in accordance with the principles of the present invention. As may be seen, this structure is divided into three distinct sections: a digital processor 50, an analog processor 52 and a transmitter/receiver head 54. While it is contemplated that each section be separately housed and located at some distance from the other two sections, the digital processor 50 and analog processor 52 may be contained in a single unit. What is important for the present invention is that the transmitter/receiver head be constructed as a separate unit, remote from the analog processor, to provide as short a line as possible to the transmitter/receiver antenna 56. The connecting RF line 58 and audio-frequency line 60 may be of arbitrary length, unless the digital and analog processor are used to drive a plurality of transmitter/receiver heads as will be described below.

In order to compensate for the length of the RF line 58, the transmitter/receiver head comprises an automatic level control and transmit amplifier 62. The output of this amplifier is supplied to a directional coupler 64 which preferentially passes the RF first signal to the antenna 56. A reply signal (the RF second signal S2) received from an interrogated transPonder is passed by the directional coupler through a bandpass filter 66 to a mixer 68. This mixer, which also receives the first signal S1 from the transmit amplifier 62, produces a third signal S3 containing frequencies which equal the sum and difference of the frequencies contained in the signals S1 and S2. The difference frequencies, in particular, are in the audio band (1-3.3 KHz). This third signal is then amplified by an amplifier 70 and supplied via the transmission line 60 to the analog processor 52.

According to the invention, the signal path length between the transmitter/receiver antenna 56 and the mixer 68 is kept short and is exactly the same for each transmitter/receiver head connected to the analog processor. This minimizes the possible information loss in the relatively weak reply signal S2 and avoids possible changes in the transponder signatures due to variations in cable length. This would occur in the preferred embodiment of the invention since the signature is affected by the delay introduced by the total transmission path; i.e., the paths (1) from the transmitter/receiver head to the transponder, (2) within the transponder itself, and (3) from the transponder to the mixer 68.

The analog processor 52 comprises a voltage controlled oscillator ("VCO") 72 which operates continuously to produce an RF signal S1. An RF switch 74 prevents this signal from passing to the output line 58 when the system is idling and during frequency calibration of the oscillator 72 Calibration is effected automatically every few minutes by a microprocessor 76 in a manner to be described below. The control voltage V is generated by a digital-to-analog converter 78 which receives a digital signal from the microprocessor 76. The output of the D/A converter 78 is amplified and passed through a lowpass filter 80 before presentation to the VCO 72. This lowpass filter eliminates small perturbations in the control voltage V which would contaminate the frequency of the RF signal S1. Preferably, the electrical leads between the D/A converter 78 and the VCO 72 are kept as short as possible to avoid interference and noise in the voltage V.

In order to permit the voltage V to ramp faster during calibration of the voltage controlled oscillator, the time constant of the lowpass filter is changed (e.g., by shorting out a resistor) by a control signal received on line 82 from the microprocessor 76.

As mentioned above, calibration of the VCO 72 is effected repeatedly and automatically every few minutes. Such calibration avoids errors due to variations in power line voltage, VCO temperature and the like. For calibration, the signal S1 is passed to a divider 84 which divides the frequency, nominally at 905 MHz, by 1,048,576 to produce an 863 Hz square wave. This square wave is applied to an interrupt input of the microprocessor 76 which determines the frequency of the signal S1 by counting the time between successive 863 Hz pulses using free-running 4 MHz clock 85 as a time standard.

Given a calibrated absolute frequency of 905 MHz, the 128 frequency steps from 905 MHz to 925 MHz are determined by noting successive constant frequency increments (Δf) above this absolute frequency. Frequency changes are determined by a delay line detector comprising a delay element 86, a mixer 88, lowpass filter 90 and a zero-crossing detector 92. The signal S1 is passed through the delay element 86 to one input of the mixer 88, and passed directly to the other input of the mixer 88. This mixer produces an output signal containing both the sum and difference frequencies of the two signals applied thereto. This output is supplied to the lowpass filter 90 which passes only the portion of the output signal containing the difference frequencies. The output of the lowpass filter is supplied to the zero-crossing detector 92 which produces a pulse at each positive (or negative) going zero-crossing. These pulses are passed to the microprocessor 76 to inform the microprocessor when the frequency of the signal S1 has changed by a fixed increment (Δf) of 156.25 KHz.

During calibration, the absolute frequency of 905 MHz is initially obtained and the digital number, supplied to the D/A converter 78, which produces this frequency is stored for later use. Thereafter, the microprocessor rapidly increments the control voltage V and stores those digital numbers, supplied to the D/A converter 78, which yield 128 different frequencies across the entire range—905 to 925 MHz—these frequencies being exactly 156.25 KHz apart. During normal operation of the interrogator apparatus, the microprocessor 76 controls the frequency of the VCO 72 by successively retrieving the digital numbers from storage and supplying a different number to the D/A converter 78 every 125 microseconds (i.e., at an 8 KHz rate). In actual operation the microprocessor inserts two additional, uniformly placed steps (in frequency and time) between the steps calculated from the delay line. This is done to help eliminate "spectral aliasing" of the difference frequencies.

The digital processor is synchronized with the 60 Hz line so that, during operation, the analog-to-digital conversion of the audio signal may be synchronized with the start of a frequency sweep. Synchronism is effected by generating an 8 KHz square wave from the 60 Hz line and applying this signal to another interrupt input of the microprocessor 76. The digital numbers suplied to the D/A converter 78 by the microprocessor 76 are synchronized with this 8 KHz clock.

The audio frequency signal S3 produced by the mixer 68 is supplied to an amplifier 94, a bandpass filter 96 and an analog signal switch 98 in the analog processor 52.

The bandpass filter 96 assures that only the difference frequencies of interest are supplied to the subsequent processing stages. The switch 98, controlled by the microprocessor 16, serves to blank the audio-frequency signal during the start of a frequency sweep to eliminate transients.

The output of the switch 98 is supplied to an anti-aliasing and analog-to-digital converter circuit 100. The analog signal is sampled for A/D conversion at 8 KHz in synchronism with the 8 KHz clock. The A/D converter presents the sampled digital values of the analog signal to a signal process 102 which determines the amplitude and phase at a plurality of audio frequencies as described above in connection with FIGS. 1-3. This amplitude and phase information is passed to a random access memory 104. A second microprocessor 106 identifies the signature of each transponder that has been interrogated and supplies the identification number associated with each transponder to a host computer 108 via an RS-232 interface. The procedure for determining these ID numbers has been described above in connection with FIGS. 1-3.

The microprocessor 106 also controls two output signals B0 and B1 which are passed to the microprocessor 76 to define four operating states of the microprocessor 76; namely, "idle", "run", "calibrate", and "test check a transponder".

FIG. 6 illustrates how the digital processor 50 and analog processor 52 in FIGS. 5A and 5B, respectively, may be employed to operate a multiplicity of transmitter/receiver heads 54. As is there shown, a number—in this case eight—transmitter/receiver heads 54, with their associated antennas 56, are connected in parallel to receive the RF first signal via line 58. This signal is passed to each transmitter/receiver head via a switch 110 controlled by an input B. The switches 110 can be operated in any sequence, or operated independently, provided that only one transmitter/receiver head receives the RF first signal at any given time. The inputs B to the several switches 110 are connected to, and receive control signals from a 3:8 decoder 112.

The audio-frequency output signals A (third signal S3) of the transmitter/receiver heads 54 are passed, via their respective lines 60, to an analog switch 114 which connects a selected one of its inputs to a single output line 116. This output line supplies the signal S3 to the audio amplifier 94 of the analog processor 52.

Both the decoder 112 and the analog switch 114 receive control inputs from the microprocessor 106 in the digital processor 50. This microprocessor 106 is thus able to select the particular transmitter/receiver head to which the RF first signal S1 will be supplied and from which the audio-frequency third signal S3 will be received.

The interrogator/receiver apparatus thus makes it possible to interrogate transponders from a plurality of different locations without requiring an expensive RF signal generator at every location. This apparatus generates the RF first signal at one, central location and supplies it to as many remote interrogation points as are required. The audio-frequency third signal, which contains the informational code from each transponder, is generated remotely at each transmitter/receiver head to isolate the informational signal of interest as soon as possible. This third signal, which can be transmitted for a substantial distance with a minimum of loss and which is not ss susceptible to interference as the second (reply) signal generated by the transponder, may then be transmitted over inexpensive twisted pair wires to the central RF signal generating station (i.e., the analog processor 52).

Figure 7:
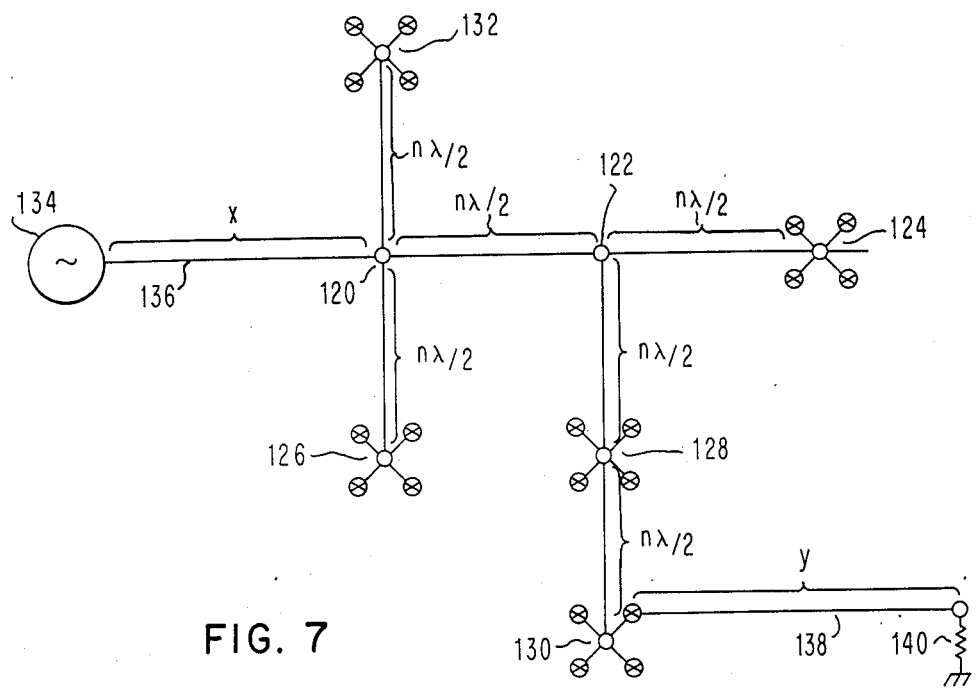
FIG. 7 is a schematic diagram of a generallized nodal network which may be employed in the embodiment of FIG. 6.

Since the different transmitter/receiver heads are in different locations, the RF cables 58 and audio-frequency lines 60 will be of different length. Whereas the lengths of the audio lines 60 are not at all critical, for the reaons given above, the RF cables 58 must be dimensioned and connected in such a way as to avoid signal reflections. FIG. 7 shows a nodal network which serves to eliminate reflections from open switches 110.

FIG. 7 illustrates a generalized nodal network comprising nodes 120, 122, 124, 126, 128, 130 and 132. Each of these nodes is connected to at least one other node via a transmission line having a length of $n\lambda/2$, where n is an integer (1, 2, 3 . . .) and $\lambda$ is the wavelength of the transmitted signal. The input node 120 of the network is connected to an RF signal generator 134 by a transmission line 136 of arbitrary length X. The node 130, which happens to be the output node in this nodal network at this instant of time, is connected to ground via a transmission line 138 of arbitrary length Y and a 50 ohm terminating resistor 140.

Associated with each of the nodes 124, 126, 128, 130 and 132 are a plurality of switches, each indicated by the symbol X . Of these switches, only the switch 142 at node 130 is closed, permitting transmission of the signal to the terminating resistor 140. All the other switches at the node 130 and at the other nodes are open.

The different switches at the different nodes may be selectively opened and closed. However, only one switch is closed at any given time. The nodal network shown in FIG. 7 prevents signal reflection from the non-terminated nodes (nodes at which all switches are open) from contaminating the RF signal.

In practice, only a limited number of switches may be connected to a given node. Space limitations prevent more than approximately five wires from emanating from a node. Thus, to provide more than four switches in an RF network, it is necessary to provide additional nodes, each spaced $n\lambda/2$ away from other nodes, so that switches may be connected to these nodes.

Figure 8:
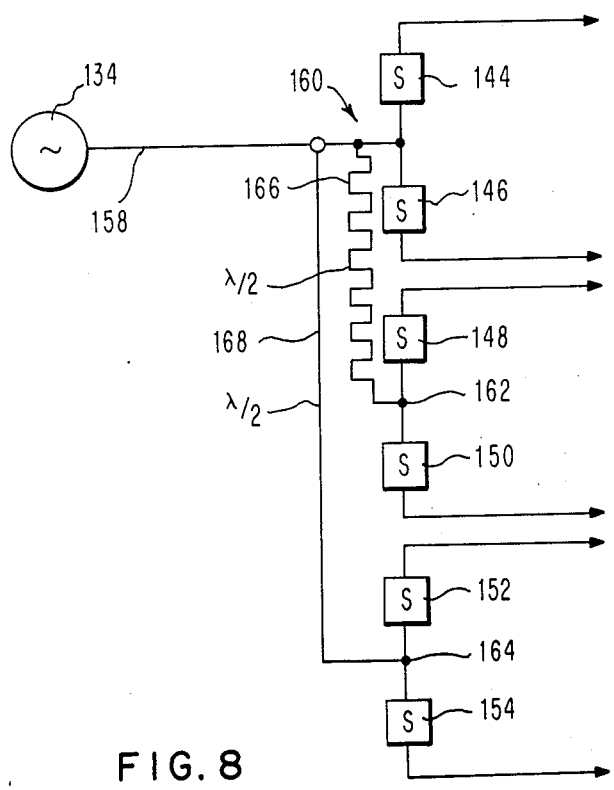
FIG. 8 is a schematic diagram of a particular nodal network which may be employed in the embodiment of FIG. 6.

FIG. 8 shows how nodes can be arranged in practice to connect an RF source 134 to a plurality of switches 144, 146, 148, 150, 152 and 154. In this case, a transmission line 158 of arbitrary length is connected to a first node 160. This node is directly connected to two switches 144 and 146 and is connected to two further nodes 162 and 164 by half wavelength transmission lines 166 and 168, respectively. Although the transmission distance over both lines 166 and 168 is the same ($\lambda/2$), the distance between opposite ends of the line 166 is about one half of that of the line 168 because the line 166 meanders back and forth to save space. The meander is dimensioned so that this transmission line 166 will not have an inductive effect at the radio frequency band used.

Figure 9:
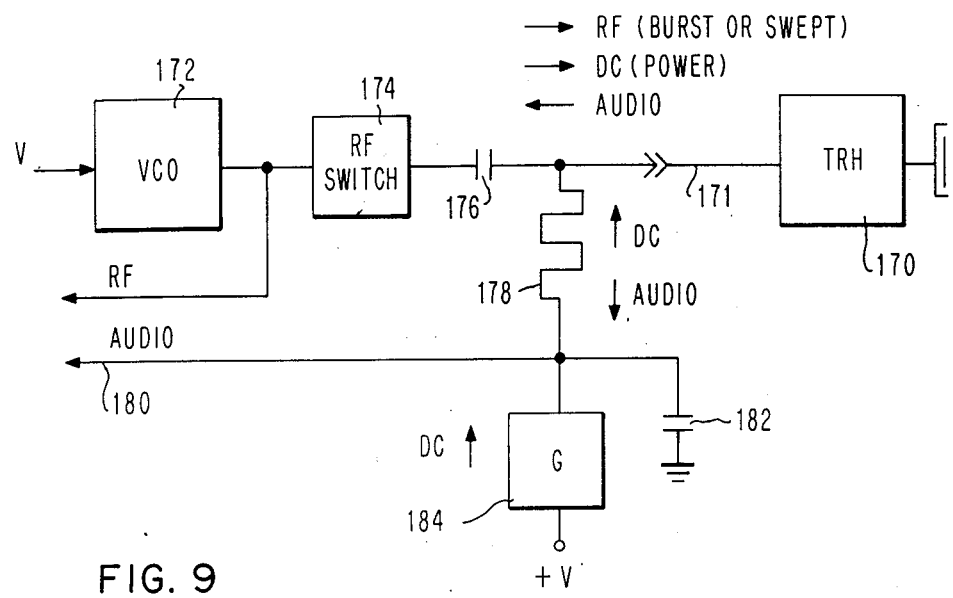

FIG. 9 illustrates a preferred embodiment, according to the invention, of a circuit for connecting a transmitter/receiver head to an RF generator in such a way that both the RF first signal (either burst or swept) and DC power is supplied to the transmitter/receiver head 170 and the audio third signal is transmitted back from the transmitter/receiver head, all on the same transmission cable 171. As may be seen, the RF signal generated by the VCO 172 and passed through the RF switch 174 is supplied to the transmission line 171 through a blocking capacitor 176. A meander line 178, having a total length of $\lambda/4$ (where $\lambda$ is the RF signal wavelength), looks like an open circuit at RF frequencies but a short circuit for audio frequencies. This line permits the audio signal transmitted back from the transmitter/receiver head 170 on the cable 171 to pass to an audio-frequency output line 180. A small capacitor 182 connected to ground terminates one end of the line 178 at the radio frequency while preventing the audio-frequency signal from being passed to ground.

A so-called "gyrator" circuit, which presents a low impedance for DC but a high impedance for AC above 2 or 3 Hz, supplies a DC voltage +V to the quarter wavelength line 178. This gyrator circuit, also known in the art as a "separator/combiner", will be described in detail in connection with FIG. 13.

FIG. 10 shows a preferred embodiment of a connection circuit which utilizes the principles illustrated in both FIGS. 8 and 9. This circuit selectively applies the RF signal to one of four transmission lines 190, 192, 194 and 196 via switches 198, 200, 202 and 204, respectively. A half wavelength line 206 separates the two nodes 208 and 210 that supply the RF signal to two switches. The transmission line following each switch includes a blocking capacitor 212, a quarter wavelength line 214, a gyrator circuit 216 and a small line terminating capacitor 218. Each circuit provides a separate analog output 220.

FIG. 11 illustrates the preferred embodiment of a transmitter/receiver head according to the present invention. Starting from the input/output terminal 230, the circuit includes an RF signal-blocking quarter wavelength line 232, an RF line terminating capacitor 234, a gyrator circuit 236 which supplies DC power on an output line 238 to all the active elements, an automatic level control amplifier 240, a lowpass filter 242, a transmit power amplifier 244, a directional coupler 246, a line terminating resistor 248, an antenna 250, a bandpass filter 252, a four quadrant multiplier or mixer 254 and an audio amplifier 256. The RF signal supplied at the input 230 is passed to the amplifier 240 which amplifies this signal to a standard, clipped level. The lowpass filter 242 serves to pass the fundamental frequencies only (blocking all harmonics) to reconstitute the sinusoidal signal at the clipped level. After further amplification by the transmit power amplifier 244, the RF signal is passed to the mixer 250 and to the antenna 250 via the directional coupler 246. This directional coupler provides electrostatic and magnetic coupling so as to preferentially pass the first signal received from the amplifier 244 to the antenna with an attenuation of approximately 10 db, and to preferentially pass the second (reply) signal received from the antenna 250 to the bandpass filter 252 with an attenuation of about 1 or 2 db. A directional coupler of this type is commercially available from Sage Laboratories, Inc., 3 Huron Drive, Natick, Massachusetts 01760 under the trademark "Wireline".

The bandpass filter 252 preferentially passes signals from the antenna in the frequency range of interest (905–925 MHz). Both the second signal from the filter 252, as well as the first signal received from the transmit amplifier 244, are applied to the mixer 254 to produce the third signal containing the sum and difference frequencies. This third signal is passed to the audio-frequency amplifier 256 which amplifies only components containing the difference frequencies and supplies this third signal, via the gyrator 236 and quarter wavelength line 232, to the input/output terminal 230.

FIG. 12 shows a diode switch which may be used as an RF switch in the embodiments of FIGS. 6, 8 and 10. This switch comprises an input terminal 260, a central terminal 262, an output terminal 264 and an intermediate terminal 266. The first diode D1 is connected in the forward direction in series with a blocking capacitor 267 from the input terminal 260 to the central terminal 262. The second diode D2 is connected in the forward direction in series with a blocking capacitor 267 from the output terminal 264 to the central terminal 262. The third diode D3 is connected in the forward direction from the intermediate terminal 266 to the central terminal 262. Each of the four terminals is connected to ground via a respective RF signal-blocking quarter wavelength line 268 and/or a line terminating capacitor 270. Control signals are applied to the input terminal, intermediate terminal and output terminal via resistors 272. The signals controlling the switch are:

| ON | OFF |
|---|---|
| V1 = +5V | 0V |
| V2 = 0V | +5V |
| V3 = +5V | 0V |

FIG. 13 shows a gyrator circuit which may be used in the embodiments of the invention shown in FIGS. 9, 10 and 11. This circuit comprises a Darlington amplifier 280 with a gain of 1, a quarter wavelength line 282, an RF line terminating capacitor 284, DC blocking capacitors 286 and 288 and a very large capacitor 290. An audio amplifier (or a transformer) 292 may be provided, as necessary. Resistors $R_e$ and $R_b$, plus the value of the capacitor 288 determine the frequency range of the circuit.

In operation, the audio signal provided from the amplifier 292 is applied to the base of the Darlington amplifier through capacitor 288. Since this amplifier has a gain of 1, it tracks this audio signal, preventing it from passing to ground. The audio signal is supplied through the quarter wavelength line 282 to the input/output terminal 294.

DC supplied from the input/output terminal 294 passes through the quarter wavelength line 282 and through the Darlington amplifier to the DC output terminal 296. The RF signal, which is blocked by the quarter wavelength line 282 is passed directly to the RF output terminal 298.

There has thus been shown and described novel interrogator/receiver apparatus which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. Interrogator/receiver apparatus for transmitting a first signal to, and receiving a second signal from a remote transponder of the type having (1) a plurality of signal conditioning means coupled to receive said fist signal, each signal conditioning means providing an intermediate signal having a known delay and a known amplitude modification to said first signal, and (2) signal combining means coupled to all of said signal conditioning means, for combining said intermediate signals to produce said second signal, said signal conditioning means and said signal combining means imparting a known informational code to said second signal, said interrogator/receiver apparatus comprising:

(a) a common means for generating said first signal, said first signal being of radio frequency (RF); and (b) a plurality of transimitter/receiver means, each being remote from, and coupled to said common RF signal generating means, for transmitting said first signal to, and receiving said second signal from a transponder, each transmitter/receiver means including means for mixing said first signal with said second signal, thereby to produce a detected third signal at said remote location containing said informational code from said transponder.

2. The apparatus defined in claim 1, further comprising (c) a plurality of controllable switch means, each connected between said common signal generating means and one of said remote transmitter/receiver means; and (d) switch control means, connected to each of said switch means, for controlling said switch means such that, at any given instant of time, only one of said switch means is in the closed position, thereby supplying said first signal from said signal generating means to only one of its associated remote transmitter/receiver means.

3. The apparatus defined in claim 2, wherein each of said switch means comprises an input terminal, a central terminal, an output terminal and an intermediate terminal; a first diode connected between said input terminal and said central terminal; a second diode connected between said output terminal and said central terminal; a third diode connected between said intermediate terminal and said central terminal; and means for controlling the DC bias applied to said diodes, thereby to control the passage of RF energy through said switch from said input terminal to said output terminal.

4. The apparatus defined in claim 2, further comprising a nodal network connected between said common signal generating means and said plurality of switch means, said nodal network comprising an input node, connected to said signal generating means, and a plurality of output nodes, each connected to one or more of said switch means, the electrical distance between said input node and each of said output nodes being approximately $n\lambda/2$, where n is an integer (0, 1, 2 . . . ) which may be different for different output nodes and $\lambda$ is the wavelength of the transmitted first signal at said radio frequency.

5. The apparatus defined in claim 4, wherein there are four output nodes, each connected to two of said switch means, and wherein the electrical distance between said input node and a first output node is nearly zero, the electrical distance between said input node and a second and third output node is approximately $\lambda/2$ and the electrical distance between said input node and a fourth output node is approximately $\lambda$.

6. The apparatus defined in claim 1, further comprising an RF transmission line coupling said common RF signal generating means with each transmitter/receiver means for transmitting said first signal to the respective transmitter/receiver means, and wherein each transmitter/receiver means includes at least one DC powered active element, said transmitter/receiver means receiving DC power from said common signal generating means via its associated transmission line.

7. The apparatus defined in claim 1, further comprising an RF transmission line coupling said common RF signal generating means with each transmitter/receiver means for transmitting said first signal to the respective transmitter/receiver means, and wherein each transmitter/receiver means includes:

(1) a common transmit/receive antenna;
(2) a directional coupler having four terminals, a first one of said terminals being coupled to said antenna, a second coupled to ground and a third coupled to said transmission line to receive said first signal;
(3) a signal mixer having two inputs and an output, one of said inputs being coupled to the fourth terminal of said directional coupler to receive said second signal and the other of said inputs being coupled to said third terminal of said directional coupler to receive said first signal from said transmission line, said directional coupler causing said first signal, received from said transmission line, to pass to said antenna and causing said second signal, received from said antenna, to pass to said mixer;

said mixer causing four quadrant multiplication of said first signal by said second signal to produce a third signal containing frequencies equal to the instantaneous difference between the frequencies of said first and said second signals.

8. The apparatus defined in claim 7, wherein each transmitter/receiver means further includes a bandpass filter connected between said directional coupler and said mixer for eliminating unwanted frequencies in said second signal.

9. The apparatus defined in claim 7, wherein each transmitter/receiver means further includes automatic level control means connected between said transmission line and said directional coupler for presenting said first signal at a standard output level, notwithstanding the length of said transmission line.

10. The apparatus defined in claim 9, wherein said automatic level control means includes amplifier means for amplifying said first signal to a clipped level and low pass filter means for blocking frequencies higher than said radio frequency, thereby to pass only a sinusoidal signal at said radio frequency.

11. The apparatus recited in claim 1, wherein said signal generating means generates, and each transmitter/receiver means transmits said first signal as an uninterrupted, continuous wave signal, and wherein said transmitter/receiver means receives said second signal simultaneously with the transmission of said first signal.

12. Interrogator/receiver apparatus for transmitting a first signal to, and receiving a second signal from a remote transponder of the type having (1) a plurality of signal conditioning means, coupled to receive said first signal, each signal conditioning means providing an intermediate signal having a known delay and a known amplitude modification to said first signal, and (2) signal combining means coupled to all of said signal conditioning means, for combining said intermediate signals to produce said second signal, said signal conditioning means and signal combining means imparting a known informational code to said second signal, said interrogator/receiver apparatus comprising:

(a) common means for generating said first signal, said first signal being of radio frequency (RF); and
(b) at least one transmitter/receiver means, remote from and coupled to said common signal generating means by means of an RF transmission line, for transmitting said first signal to, and receiving said second signal from a transponder, said transmitter/receiver means including:
(1) a common transmit/receive antenna;
(2) a signal mixer having two inputs and an output, one of said inputs being coupled to said transmission line; and
(3) coupler means connected to said antenna, to said mixer and to said transmission line for preferentially passing said first signal from said transmission line to said antenna and preferentially passing said second signal from said antenna to said mixer, wherein said mixer causes four quadrant multiplication of said first signal by said second signal to produce a third signal containing frequencies equal to the instantaneous difference between the frequencies of said first and said second signals.

13. The apparatus defined in claim 12, wherein said transmitter/receiver means further includes a bandpass filter connected between said coupler means and said mixer for eliminating unwanted frequencies in said second signal.

14. The apparatus defined in claim 12, wherein said transmitter/receiver means further includes automatic level control means connected between said transmission line and said coupler means for presenting said first signal at a standard output level, notwithstanding the length of said transmission line.

15. The apparatus defined in claim 14, wherein said automatic level control means includes amplifier means for amplifying said first signal to a clipped level and low pass filter means for blocking frequencies higher than said radio frequency, thereby to pass only a sinusoidal signal at said radio frequency.

16. The apparatus recited in claim 12, wherein said signal generating means generates, and said transmitter/receiver means transmits said first signal as an uninterrupted, continuous wave signal, and wherein said si8nal mixer receives said second si8nal simultaneously with the transmission of said first signal and produces said third signal as a continuous wave.

* * * * *